United States Patent [19]
Turner

[11] Patent Number: 5,359,207
[45] Date of Patent: Oct. 25, 1994

[54] WEDGE SCANNER UTILIZING TWO DIMENSIONAL SENSING ARRAYS

[75] Inventor: William D. Turner, San Marino, Calif.

[73] Assignee: Xerox Corporation, Stamford, Conn.

[21] Appl. No.: 158,676

[22] Filed: Nov. 29, 1993

[51] Int. Cl.$^5$ .......................................... H01L 27/14
[52] U.S. Cl. ...................................... 257/81; 257/84; 257/98; 257/432; 257/466; 257/443; 359/831; 250/370.14; 250/208.1
[58] Field of Search ................. 257/98, 432, 443, 466, 257/80, 81, 82, 84, 85; 359/831; 250/208.1, 568, 370.09, 370.06, 370.11, 370.14

[56] References Cited

U.S. PATENT DOCUMENTS 5,218,223  6/1993  Spaeth et al. .................... 257/98 X
5,227,648  7/1993  Woo ................................. 257/432 X

FOREIGN PATENT DOCUMENTS 60-128425  7/1985  Japan .
62-145960  6/1987  Japan .
3104286    5/1991  Japan .................................. 257/432
0461551    2/1992  Japan .
4117761    4/1992  Japan .

*Primary Examiner*—William Mintel

[57] ABSTRACT

The present invention is a novel book scanner that employs 2-dimensional array detectors attached, either rigidly or rotatably, at a common edge and disposed in a wedge shaped manner. The opposite edges of the arrays are housed in a base portion. The base portion additionally supports backlight to provide the necessary illumination of the book pages and the read-out electronics which output the image data stored in the detectors to other processing units that may use such data.

7 Claims, 8 Drawing Sheets

WEDGE SCANNER UTILIZING TWO DIMENSIONAL SENSING ARRAYS

FIELD OF THE INVENTION

The present invention relates in general to scanners that simultaneously scan both pages of an open book without undue stress on the binding; and, in particular, to wedge scanners that employ two-dimensional sensing arrays.

BACKGROUND OF THE INVENTION

Before xerography, making copies of documents and books was primarily a manual process. Typesetting and carbon copies helped to automate this process somewhat for the creation of documents. However, copying already existing documents was done chiefly by hand.

The advent of xerography created a relatively inexpensive and automated means for making copies of existing documents. The first copiers were relatively slow (approximately 1 page per minute) and pages were manually fed. Today, a state of the art copier can produce copies at over 100 pages per minute. Additionally, document feeders, attached to the basic copier, allow users to copy great stacks of pages at a time automatically.

While copier speed has improved over time, current copiers employ fairly much the same technology used by their predecessors—light/lens copying. Essentially, a light/lens copier works by moving a scanning bar across the entirety of a page. The bar illuminates a portion of the page and its image is reflected and focused by an optical system of lens and mirrors to an image capturing device, such as photoreceptor. The image of the page is scanned line by line until the scanning bar has moved down the entire length of the page—usually by a system of wheels and pulleys.

While the traditional light/lens copiers work well for the reproduction of loose document pages, this type of copier does not work so well for the reproductions of bound pages, such as found in a book. Most conventional copiers still employ a fiat plate glass surface on which the document pages are positioned for image capture. In reproducing book pages, the book is opened to the pages of interest and held, face down, to allow the copier to capture the image. On a fiat plate, this process stresses the binding of a book over the course of repeated copying. This stressing is even greater if the user pushes down on the spine of the book to insure that the image is not distorted by the natural curvature of a book page at the point where it connects with the spine.

Attempts have been made to rectify the problem of undue stress by improving on the flat plate that accompanies the traditional light/lens copier. One such attempt is disclosed in Xerox Disclosure Journal, Volume 9, Number 6, at page 383, dated November/December 1984 by Vinod K. Agarwal and entitled "Book Copying Apparatus". Agarwal discloses the use of two platens that are joined together to form a "wedge" shape that allows the spine of the book to rest upon the corner of the wedge while the two opposite pages contact the surfaces of each respective platen. It is the shape of the wedge that reduces the amount of stress to the spine by allowing copies to be made of opposing pages without forcing the spine to be stretched beyond the angle defined by the wedge.

An exposure lamp is disposed adjacent to the corner of the wedge to illuminate both pages for reproduction. Opposing book pages are scanned in Agarwal's system by moving the exposure lamp first down the entirety of one opposing page and then down the other opposing page.

Another attempt is disclosed in laid-open German patent application number DE 35 45 404 A1, application date Dec. 31, 1985, laid-open date Jul. 2, 1987 by Hubert Pfreimter. Pfreimter improves upon the wedge concept for image reproduction. Essentially, Pfreimter uses an arrangement of movable mirrors to produce virtual images of opposing book pages. These virtual images may be projected simultaneously to some means of image capture not disclosed by Pfreimter.

Both Agarwal and Pfreimter require moving parts to create opposing page images. Agarwal requires a moving exposure lamp that creates reproductions in the traditional light/lens method. Pfreimter has an arrangement of moving mirrors that create simultaneous virtual images; but does not disclose a means for capturing these images onto an intermediate substrate. The motion of these mechanical parts represent the majority of the time spent in scanning opposing book pages. It is thus desirable to scan opposing pages simultaneously without the use of moving mechanical parts.

Recently, a faster method of image scanning and capture has been developed using fiat panel detectors. These detectors comprise an array of thin film transistors and sensors that function as pixel element detectors. These thin film elements are generally constructed over a translucent substrate such as glass, forming a two dimensional detecting surface. Such thin film arrays are disclosed in U.S. Pat. No. 5,017,989 issued on May 21, 1991 to Street et al and in U.S. Pat. No. 5,079,426 issued on Jan. 7, 1992 to Antonuk et al., both of which are herein incorporated by reference.

These fiat two-dimensional detectors have the unique property that they are able to capture an image without moving mechanical parts. Antonuk et a discloses an array structure that captures an images across all its pixel elements simultaneously. The image information is then read out by sequentially addressing each pixel. The exact structure and operation of the detector is described in greater detail in the above-mentioned patent and in context with the present invention below.

With the advent of these new image capturing devices, it is thus an object of the present invention to provide a book scanner that does not have moving, mechanical parts for the capture of opposing book page images.

SUMMARY OF THE INVENTION

In summary, the present invention is a novel book scanner that employs 2-dimensional detector arrays attached, either rigidly or rotatably, at a common edge and disposed in a wedge shaped manner. The opposite edges of the arrays are housed in a base portion. The base portion additionally supports backlighting to provide the necessary illumination of the book pages and the read-out electronics which output the image data stored in the detectors to other processing units that may use such data.

One advantage of the present invention is that it provides a way to copy book pages quickly without undue stress to the binding of the book.

Another advantage of the present invention is speed. The present invention does not use moving, mechanical parts. Thus, the speed of the present wedge scanner is generally faster than mechanisms employing such mechanical parts.

Another advantage of the present invention is quietness. The present invention does not have the attendant noise typically generated by moving mechanical parts. Thus, the present invention is ideally suited to an environment where the quiet scanning of books is a major consideration, such as a library.

Yet another advantage of the present invention is its reliability and maintainability. The present invention is constructed from electronic components which generally have a greater longevity than moving mechanical parts.

Yet another advantage of the present invention is that the wedge scanner could be used as an image capturing front-end. The data output from the wedge could then be used by any other processing unit that can use image data. For example, the image data could be supplied to a copier, fax, or the like. Additionally, with the use of optical character recognition (OCR) and speech processing software, the image data may be used to read books to the blind.

Additional objects and features of the present invention will be more readily apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the drawings.

FIG. 8A connects each vertical grid line to an interconnect circuit. FIG. 8B connects together each pair of vertical grid lines from the two detectors.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the present invention as defined by the appended claims. Thus, the present invention is not intended to be limited to the embodiment shown, but is to be accorded the widest scope consistent with the principles and features disclosed herein.

Figure 1:
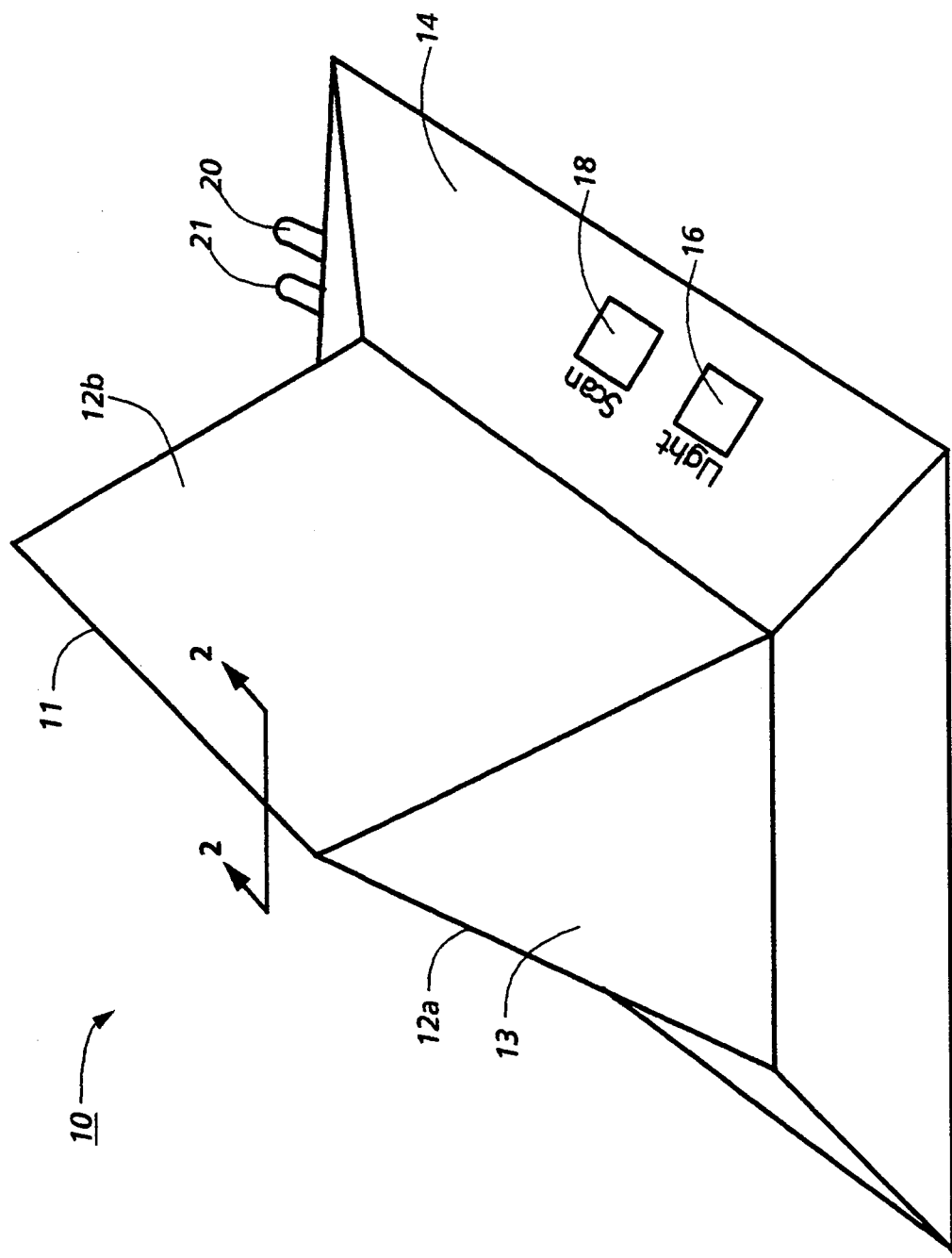
FIG. 1 is a perspective view of a first preferred embodiment of a wedge scanner made in accordance with the principles of the present invention. The first scanner embodiment employs a two-dimensional detector array that spans across a wedge comprising two sides that have a rigidly affixed common edge.

Referring now to FIG. 1, a perspective view of a first preferred embodiment of a wedge scanner 10 is shown made in accordance with the principles of the present invention. Wedge scanner 10 comprises two 2-dimensional detector arrays 12a and 12b that are rigidly attached at a common edge 11. The detector arrays are comparatively thin sheets of substrate that project downward to form the "wedge" shape of the scanner. Translucent blocks made of light diffusing material, such as plexiglass, are placed within the wedge at 13 to provide diffuse lighting for proper illumination of the image page through the detector arrays. Detectors 12a and 12b are supported upon base 14 which houses both the backlighting necessary to illuminate opposing book pages as well as necessary electronics to address and read out the image data captured by the detectors.

Switch mechanisms 16 and 18 are provided on the housing to give users control of backlighting and scanning respectively. These functions could, alternatively, be provided by a single control switch. Lines 20 and 21 connect with base 14 to supply the scanner with power and to output image data, respectively. It will be appreciated that the present invention is not limited by the particular design of the first presently preferred embodiment provided in FIG. 1. In fact, any wedge-shaped scanner design comprising two 2-dimensional detector arrays providing a similar level of functionality is encompassed by the present invention.

Figure 3:
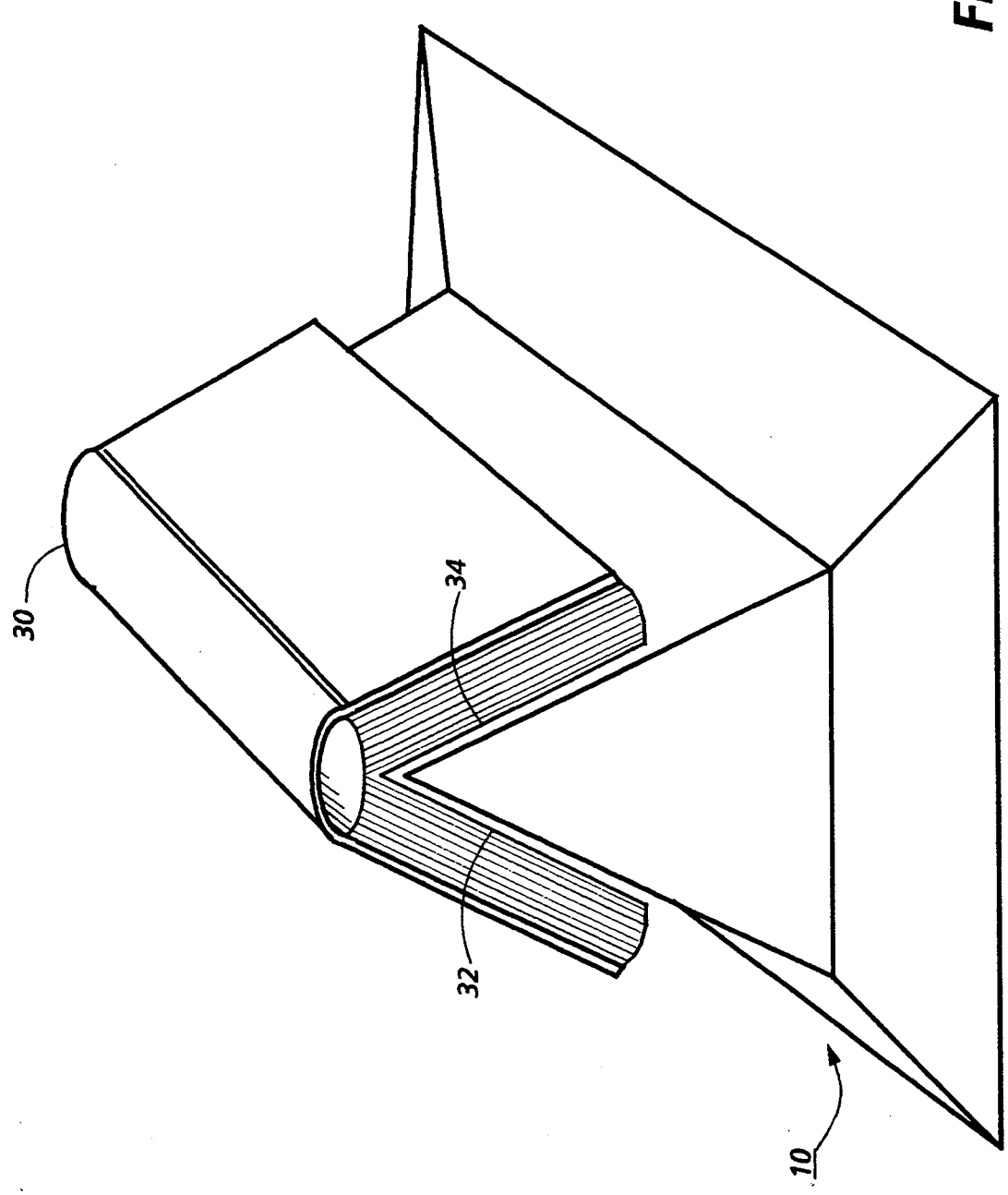
FIG. 3 depicts the manner of use of the present invention. A book rests on the wedge scanner as it scans opposing pages.

FIG. 3 depicts the wedge scanner 10 in use. The spine of book 30 is shown resting on the edge 11 of the wedge. Opposing pages 32 and 34 lie adjacent each detector 12a and 12b, for being scanned. As will be discussed further below, the pages to be scanned should ideally be contacting the surface of the detectors, or in reasonably close proximity, to produce a usable image.

Figure 2:
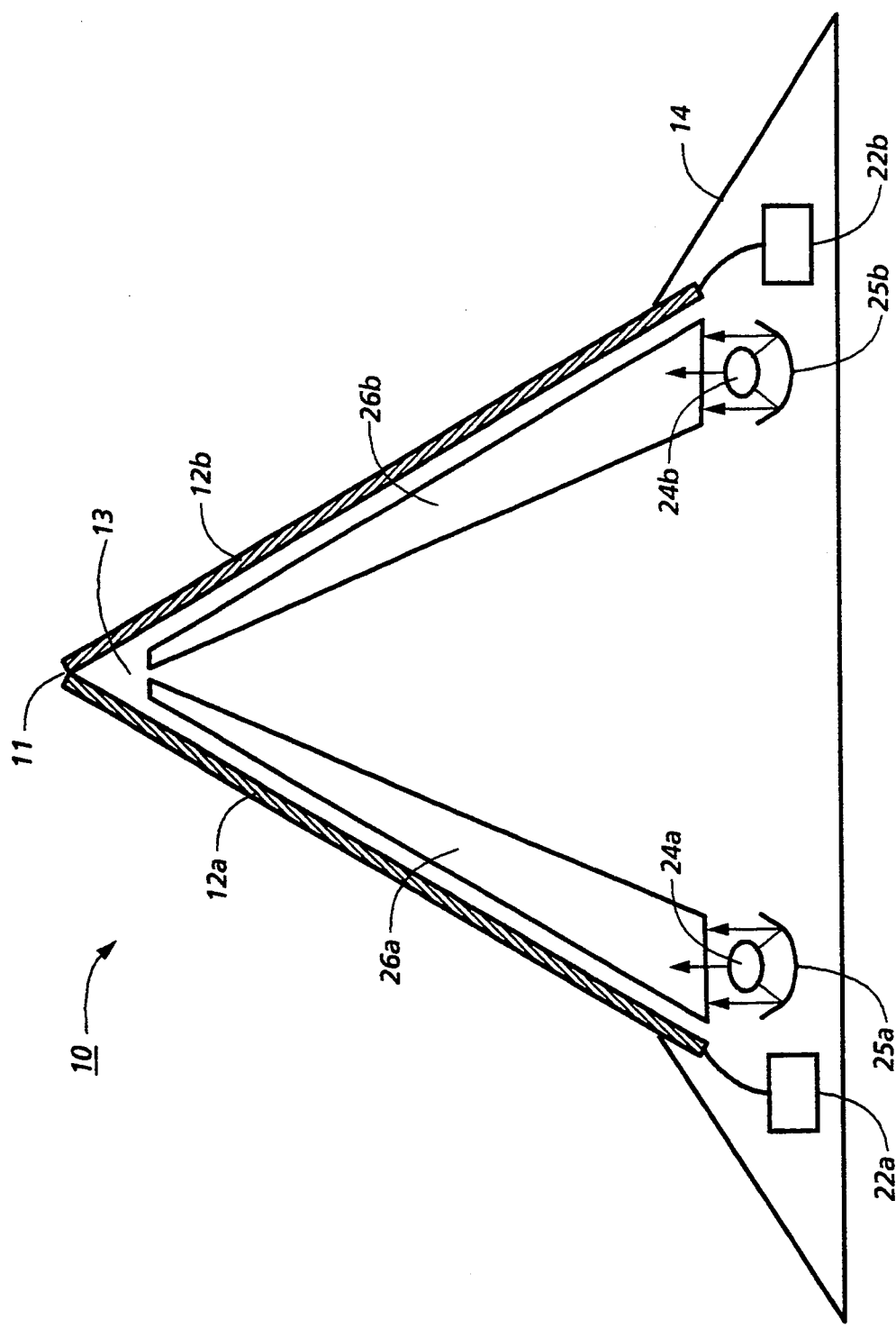
FIG. 2 is a side sectional view taken substantially in the direction of arrows 2—2 in FIG. 1.

A side sectional view of the first presently preferred embodiment is presented in FIG. 2. Lights 24a and 24b are disposed inside base 14 to provide the necessary backlighting of the book pages to be copied. Lights 24a and 24b are controlled by the user via switch 16 (not shown in FIG. 2). The light emanating from the lights is reflected by concave mirrors 25a and 25b respectively into the bottom surface of translucent blocks 26a and 26b. As mentioned previously, the translucent material could be plexiglass or any like material that diffuses light sufficiently. Diffuse lighting affords better imaging with the thin film transistor and sensor structures that are used in the presently preferred embodiments. Additionally, the surface of the translucent blocks remote from the detectors might also have a mirrored coating to increase the illumination on the image page. As an alternative, a standard backlighting arrangement used in current liquid crystal displays delivers reasonably diffused lighting for the purposes of the present invention.

Read-out electronics 22a and 22b are coupled to detectors 12a and 12b respectively. As will be discussed in greater detail below, the read-out electronics have both address and data-receive logics sufficient to address and read-out image data from individual pixels. As shown in FIG. 2, there are two separate read-out electronics—one for each individual detector. In an alternative embodiment, however, the two array detectors could be electrically coupled so that the two detectors are in actuality one addressable surface. In such a case, only one set of address logics would be needed for the scanner. This implementation will be discussed in greater detail below.

Figure 4:
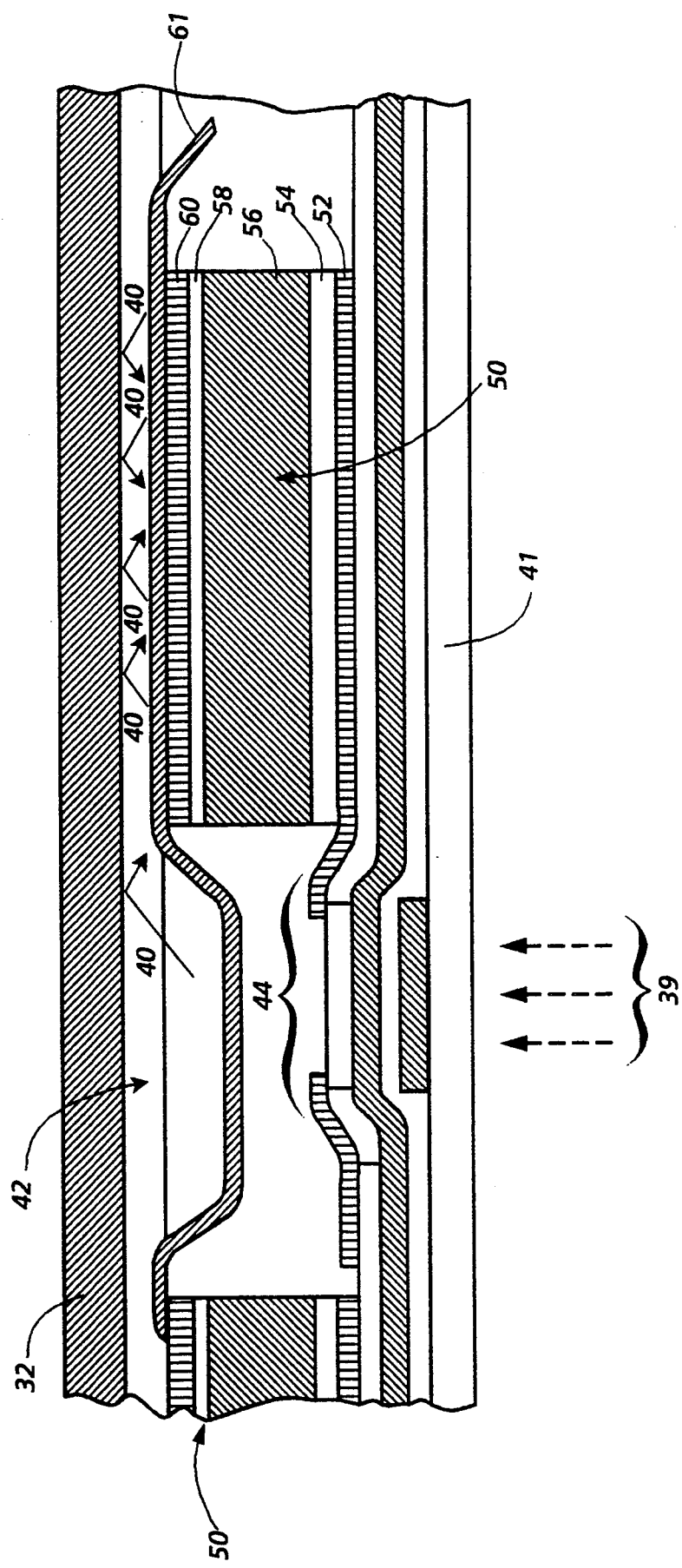
FIG. 4 is a cross-sectional side view of a typical pixel element found on a 2-dimensional detector suitable for the purposes of the present invention.
Figure 5:
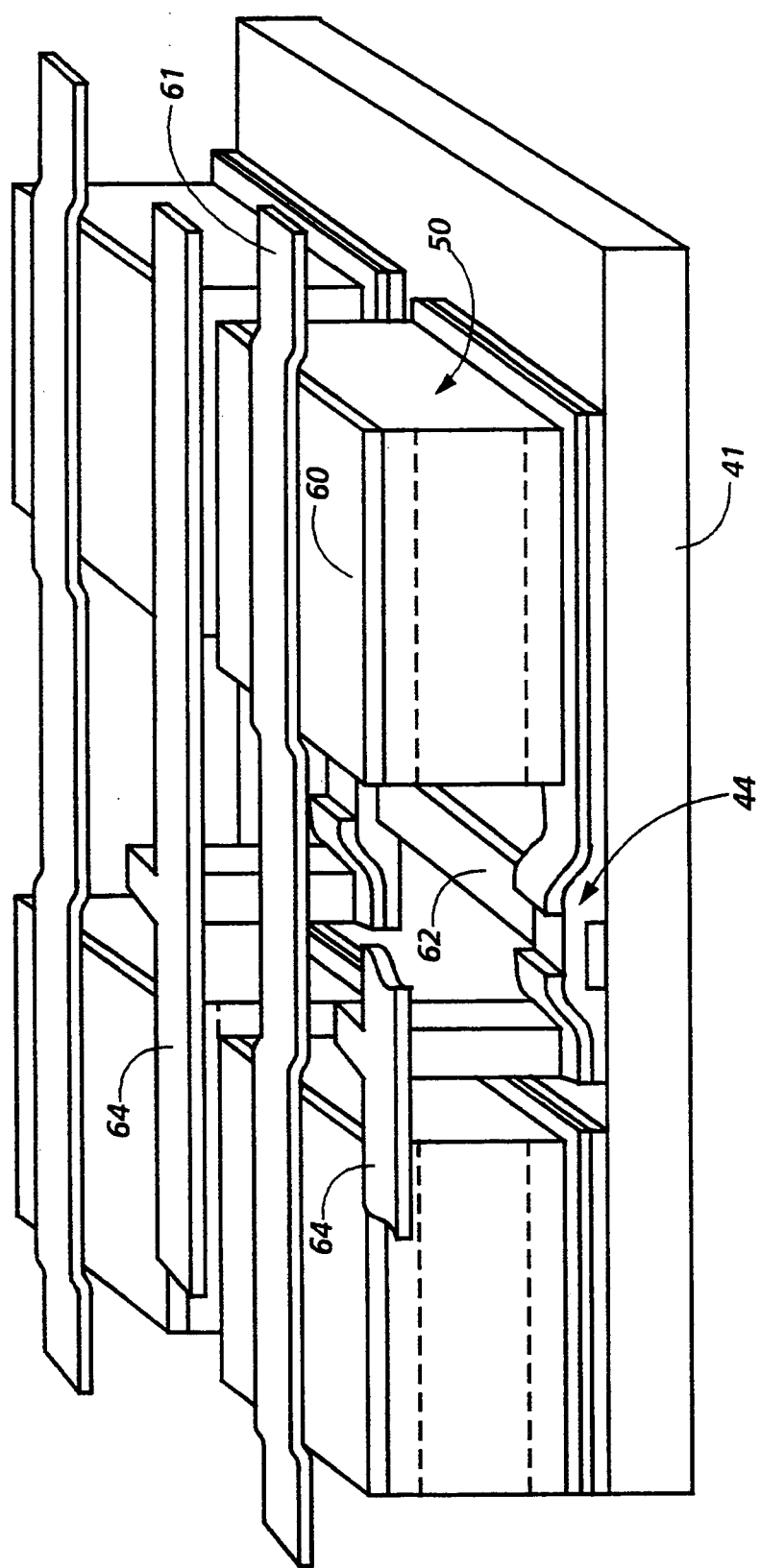
FIG. 5 is a cut-away, perspective view of a typical pixel element.

Having discussed the overall design of the present invention and manner of use, the 2-dimensional detector arrays comprising the sides of the wedge will now be described in greater detail. FIG. 4 is a side sectional view of a typical pixel element used on the presently preferred array detector. FIG. 5 is a cut-away, perspective view of the pixel element of FIG. 4. It will be appreciated, however, that the present invention should not be limited to the choice of the presently preferred detector. In fact, any non-mechanical detector that captures an image by substantial contact with a page is suitable for the purposes of the present invention.

As shown in FIG. 4, a single pixel element comprises a sensor 50 electrically coupled to a thin film transistor 44. Sensor 50 is constructed atop a transparent substrate 41 made of glass or some other suitable material. The first layer of sensor 50 is an opaque conductive layer 52. Conductive layer 52 serves two purposes: first, it prevents light rays 39 from directly passing through sensor 50 and, second, it provides electrical connection to transistor 44.

Heavily doped N-type a-Si:H layer 54 (approximately 400 Å thick), intrinsic a-Si:H layer 56 (ranging from a few thousand Angstroms to several microns thick), and a heavily doped P-type a-Si:H layer 58 (approximately 100 Å thick) sit on top of the conductive layer 52 and form a p-i-n photodiode. An upper electrode 60 sits atop layer 58 and connects to biasing line 61. Upper electrode 60 is made of a transparent material to allow the reflected light 40 to pass through to the photodiode. A final protective, transparent layer 42 (approximately 50 μm thick) covers the structure and provides the resting surface for book page 32. The construction and structure of both sensor 50 and thin film transistor 44 is further disclosed in incorporated U.S. Pat. No. 5,079,426.

In operation, sensor 50 stores information about that portion of the image that are immediately adjacent to it. Light rays 39 emanating from backlight 24a and 24b is transmitted through the transparent substrate 41. All direct rays to sensor 50 are stopped by the opaque conductive layer 52. Thus, rays 39 are transmitted in the gaps between adjacent sensors 50. Rays 39 eventually reach page 32 and reflect back (as reflected rays 40) towards the detector. The amount of reflected light 40 reaching sensor 50 is dependent upon the proximate surface characteristics of the page 32. More rays are reflected back into the sensor 50 if the page surface proximate to the sensor is predominately "white". Likewise, if the page surface proximate to sensor 50 is "black", less rays will be reflected back towards the sensor.

Some of these reflected rays 40 impinge upon the detector at the sensor 50. When a light ray 40 is absorbed in the intrinsic layer 56, a electron-hole pair is formed. As explained in greater detail in the above-incorporated U.S. Pat. No. 5,079,426, the electron-hole pairs are separated and collected at opposite ends of the photodiode under the influence of an electric field produced by upper electrode 60. The amount of separated electron-hole charge represents the image of the page proximate to sensor 50. This is so because the amount of collected charge is directly proportional to the amount of reflected rays absorbed by sensor 50. As explained below, this charge is held until the data is needed and read out through thin film transistor 44 and read-out electronics 22.

Individual pixel sizes (as shown covered by layer 60) in the presently preferred embodiment can be either 127 μm square (for 200 spi coverage) or 85 μm square/for 300 spi). The sensor size should be small enough to fit the pixel while leaving a sufficient gap for light to transmit through to the page. The "fill fraction" is defined as the fraction of the pixel area used by the sensor. A fill fraction in the range of 25 to 70% is suitable for adequate page lighting.

Figure 6:
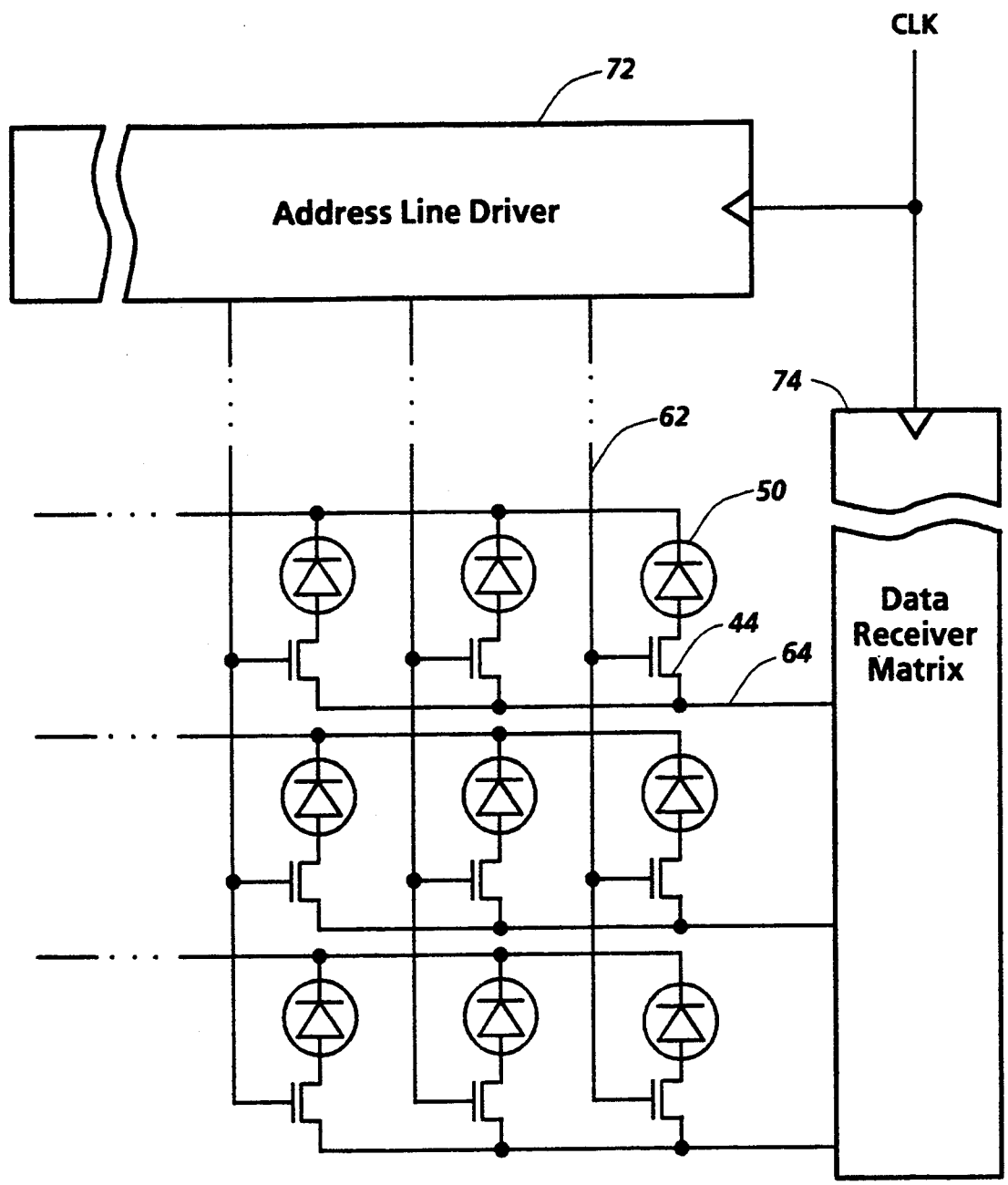
FIG. 6 is a schematic view of the sensor and thin film transistor array coupled to the read-out electronics.

FIG. 6 is a simple schematic of the array of sensors and transistors coupled to the read-out electronics. Each transistor 44 is connected to a pair of lines, address line 62 and data-receive line 64. Each address line 62 connects a plurality of transistors 44 via their gates in a columnar arrangement. The drain of each transistor is connected in row fashion to a data-receive line 64 which is in turn connected to the input terminals of a data receiving matrix 74.

Address line driver 72 and data receiving matrix 74 enable the flow and capture of image data from the sensors respectively. Both the address line driver and the data receiving matrix must be synchronized in order that meaningful data may be retrieved from the array of detectors. This synchronization may be accomplished by inputting a clock signal to each of address line driver 72 and data receiver matrix 74 via line CLK. It will be appreciated that the actual logical design of both the address line driver and the data receive matrix are well known to those skilled in the art of circuit design.

In operation, the image data is stored in the array as an electric charge in each of the sensors 50 until it is "read out". The charges in these sensors are read out a column at a time and stored in the data receiver matrix 74. The process of reading out starts with a clock signal that induces address line driver 72 to enable a single address line 62. The gates of the transistors 44 that are coupled to that address line thereby become enabled and the stored charge in sensor 60 is allowed to flow to the data receiver matrix 74 via data-receive line 64. A column of pixel data is thus captured. This process continues until the entire array is read out, column by column.

Figure 7:
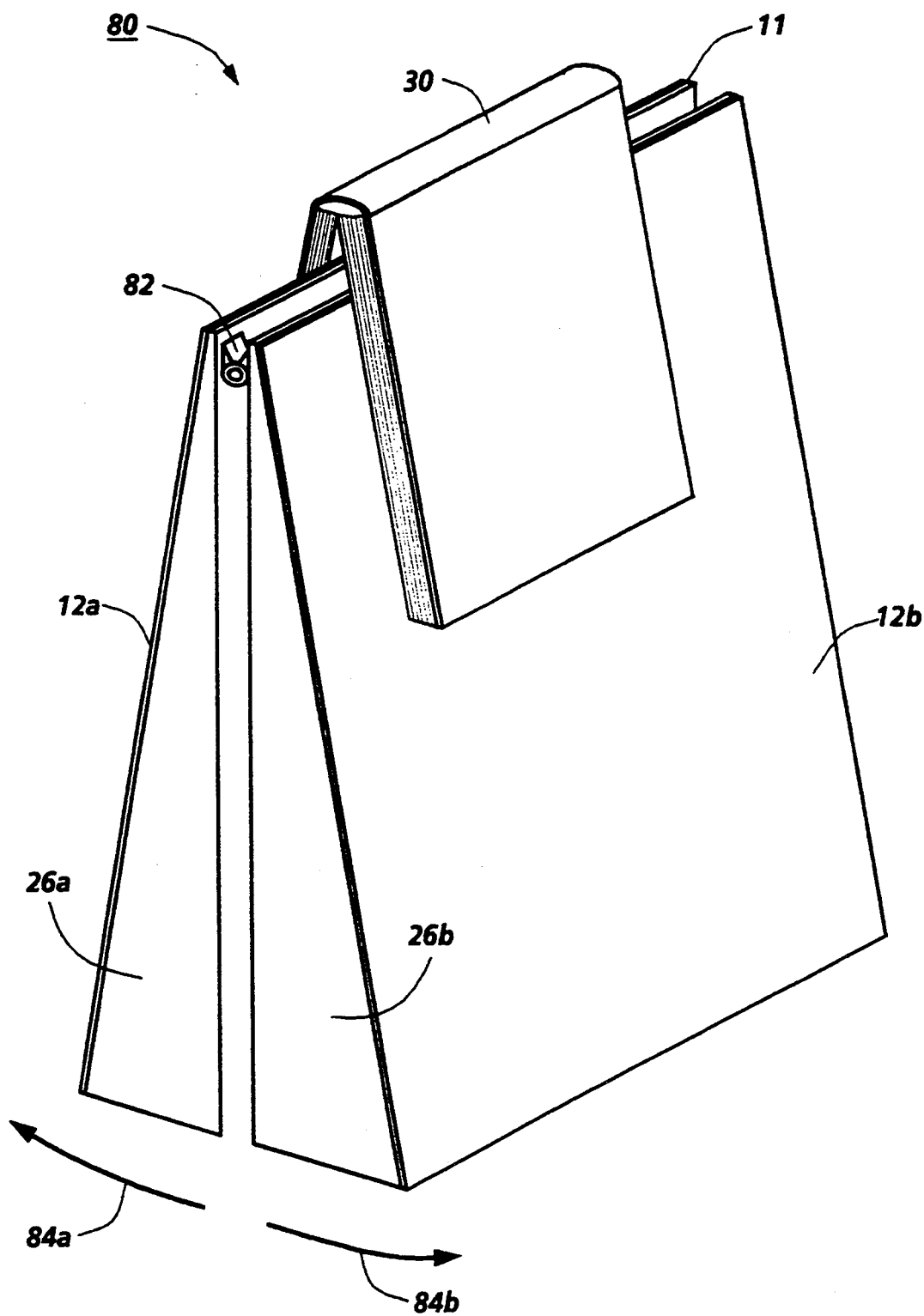
FIG. 7 is a perspective view of a second preferred embodiment of the presently claimed wedge scanner. The second scanner embodiment comprises two side surfaces that have a rotatably affixed common edge that allows for individual adjustment of the wedge according to the particular book being copied.

FIG. 7 shows a second preferred embodiment of the wedge scanner. Scanner 80 is constructed so that the common edge 11 of the two detectors 12a and 12b is rotatably coupled by a hinge 82 or the like. The two detectors, together with their respective translucent blocks 26a and 26b, may rotate in the direction of arrows 84a and 84b respectively. It will be appreciated that suitable modifications can be made to the base (not shown in FIG. 7) to support scanner 80 and are well known to one skilled in the art.

This second embodiment is desirable because different books have different mechanical strengths in the spine and different weights of paper for their pages. The wedge of the second embodiment may vary its angle to optimize the mechanical interaction with the book to improve the physical contact of the pages with the detector surfaces.

Figure 8A:
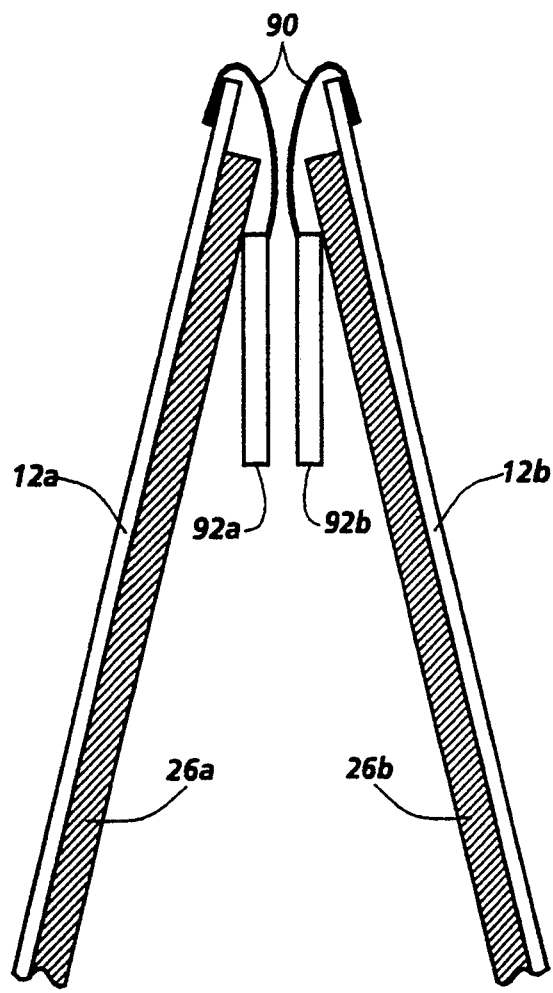
FIGS. 8A and 8B depict two implementations of creating one logical scanning surface from two detectors.
Figure 8B:
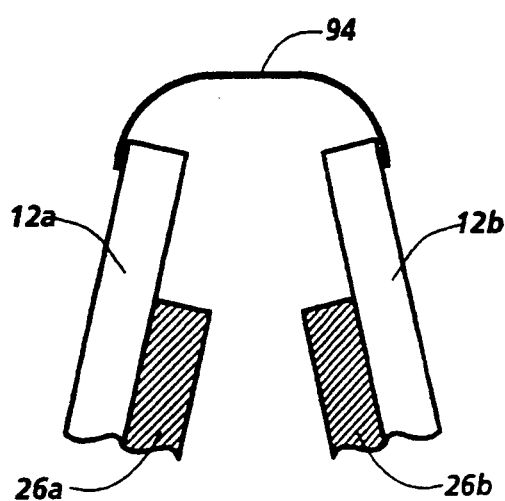

As mentioned previously, the two detector surfaces can be coupled so as to make one logical scanning surface. FIGS. 8A and 8B depict two implementations of a single scanning surface. FIG. 8A shows detectors 12a and 12b connected to interconnect circuits 92a and 92b via a flexible connector 90. The circuits 92a and 92b may further connect to a processor or other logic circuits (not shown) to provide the logical mapping of the two scanning surfaces to a single surface. Alternatively, the two circuits could themselves be connected by another flexible connector (not shown).

The flexible connector 90 may be any electrical material having sufficient flexibility (e.g. polymide) to withstand repeated bendings, as would be the case with the second preferred embodiment detailed in FIG. 7. The connector could be mated to the detector or the circuit either by soldering, anisotropic adhesive, or the like.

A second implementation for creating one effective scanning surface is merely to connect the two scanning surfaces 12a and 12b together with flexible connector 94. Flexible connectors 90 or 94 would connect a single pairs of corresponding address or data-receive lines on the detectors 12a and 12b. Logically then, the grid lines on the detector surface that cross vertically from one detector to another would be electrically extended to one set of grid lines. Suitable modifications to the read out electronics to treat the two surfaces as one is well known to those skilled in circuit design.

In summary, the present invention is a novel wedge scanner that copies opposing book pages without the use of moving, mechanical parts. Although the current application discloses a presently preferred 2-dimensional array constructed of thin film transistors and sensors, it should be appreciated that the present invention envisions and encompasses the use of any other two-dimensional array detectors.

What is claimed:

1. A scanner for capturing the image of pages in a book, said scanner comprising:
    a substantially wedge shaped member having an apex and a pair of angularly splayed surfaces extending from said apex, upon which a partially opened book may be supported with its spine adjacent said apex and its opposing pages adjacent said surfaces;
    a 2-dimensional detector located upon each of said surfaces for collecting image data;
    a light source for illuminating the opposing pages through said detector; and
    read-out circuitry connected to said detector for obtaining image data collected by said detector.

2. A scanner for capturing the image of pages in a book, said scanner comprising:
    a first and a second 2-dimensional detector, each detector having a surface, a first edge and a second edge opposite said first edge, said detectors coupled at said first edges such that said surfaces are disposed in a substantial wedge shape;
    a light source for illuminating the opposing pages through said detector; and
    read-out circuitry connected to said detector for obtaining image data collected by said detector.

3. A scanner as recited in claim 2 wherein said first and second detectors are rigidly coupled at said first edges.

4. A scanner as recited in claim 2 wherein said first and second detectors are rotatably coupled.

5. A scanner as recited in claim 2 wherein said first and second detector are electrically coupled such that there is one logical scanning surface.

6. A scanner as recited in claim 5 wherein the first and second detectors, each detector having grid lines, are coupled such that each pair of corresponding grid lines is connected by a connector.

7. A scanner as recited in claim 5 wherein the first and second detectors, each detector having grid lines, are coupled such that each grid line from each said detector is connected to an interconnect circuit.

* * * * *